United States Patent [19]
Vilain et al.

[11] Patent Number: 5,912,464
[45] Date of Patent: Jun. 15, 1999

[54] INFRARED DETECTOR AND MANUFACTURING PROCESS

[75] Inventors: Michel Vilain, St. Georges de Commiers; Jean-Jacques Yon, Sassenage, both of France

[73] Assignee: Commissariat al'Energie Atomique, Paris, France

[21] Appl. No.: 08/905,059

[22] Filed: Aug. 1, 1997

[30] Foreign Application Priority Data

Aug. 8, 1996 [FR] France ................................. 96 10005

[51] Int. Cl.⁶ ......................... H01L 31/09; H01C 17/075
[52] U.S. Cl. ...................................................... 250/338.4
[58] Field of Search ........................................ 250/338.4

[56] References Cited

U.S. PATENT DOCUMENTS

| | | | |
|---|---|---|---|
| 4,640,629 | 2/1987 | Antonini et al. | |
| 5,095,215 | 3/1992 | Shorrocks et al. | 250/338.1 |
| 5,367,167 | 11/1994 | Keenan | 250/338.4 |

FOREIGN PATENT DOCUMENTS

| | | |
|---|---|---|
| 0 534424 | 3/1993 | European Pat. Off. |
| 0 534768 | 3/1993 | European Pat. Off. |
| 0 566156 | 10/1993 | European Pat. Off. |
| 93/25878 | 12/1993 | WIPO |

OTHER PUBLICATIONS

Review of Scientific Instruments, vol. 64, No. 7, Jul. 1993, New York, US, pp. 1714–1717, XP000387100, E. Iborra et al. "A New Design of a Semiconductor Bolometer on Rigid Substrate for Fusion Plasma Diagnostics".

*Primary Examiner*—Constantine Hannaher
*Attorney, Agent, or Firm*—Pearne, Gordon, McCoy & Granger LLP

[57] ABSTRACT

An infrared detector includes a sensitive part having a sensitive element and conducting elements. The sensitive element includes a layer of material in which the resistivity varies with the temperature. The conducting elements perform the functions of electrodes for the detector and infrared absorber. At least one support element for the sensitive part is capable of positioning the sensitive part, electrically connecting the sensitive part to a readout circuit, and thermally insulating the sensitive part from the rest of the structure. All conducting elements are places on the same surface of the layer of temperature sensitive material. The detector is manufactured according to a forming and etching process.

24 Claims, 10 Drawing Sheets

INFRARED DETECTOR AND MANUFACTURING PROCESS

DESCRIPTION

1. Technical Field

This invention relates to an infrared detector and the process for manufacturing it. It relates to the field of infrared radiation detectors, and more precisely to resistive microbolometers operating at ambient temperature.

2. State of Prior Art

Optical radiation detectors are based on various radiation/material interaction modes, for example quantum, photoconductor and photovoltaic detectors directly convert radiation energy into free electrical carriers. These carriers are collected by suitable means such as a natural polarization or a polarization applied to the detector, and form the source of the electrical signal that depends on the illumination received by the detector. Other detectors called bolometers are particularly suitable for infrared radiation, and convert the energy into a temperature rise. The signal produced is the image of the detector temperature. The conversion from the thermal signal to the electrical signal is the result of an electrical property such as the conductivity, dielectric susceptibility, or other, of a material or assembly of materials in the bolometer that varies with the temperature. In a very simplified manner, the performances of the quantum detector are proportional to the number of carriers collected for a given illumination. The performances of a bolometer are proportional to the temperature rise $\Delta T$ under the effect of a given illumination, modulated by the relative rate of variation of the measured electrical magnitude G with the temperature, namely $\Delta T.dG/G.dT$. For a resistive bolometer with resistance R, we are concerned with the magnitude $dR/R.dT$, otherwise denoted TCR.

Usually, the interesting infrared wave lengths are close to 4 micrometers or 10 micrometers for land applications following the existence of transmission windows related to the nature of the atmosphere. Unitary detectors have minimum lateral dimensions (in the plane of the image) of a few wave lengths, which gives a few tens of micrometers for devices adapted to the 8 to 12 $\mu$m band. These devices are then called "microbolometers".

Unlike most infrared quantum detectors which require cooling, a detector of this type is inherently capable of operating at ambient temperature, provided that it is possible to discriminate a temperature rise due to an incident radiation (the signal) from the various ambient noise sources (thermal, electrical, etc.). This function depends on associated circuits and the way in which they are used. Their final performances depend on a few "technological" parameters which are explained in the description.

Beneficially, scenes can be observed in infrared radiation using a microbolometer by means of matrices (or retinas) of NxM unitary bolometric points (pixels) individually associated with circuits that generate operating stimuli and process the resulting electric signal. These circuits are beneficially installed directly in a "monolithic" or "hybrid" assembly, below the microbolometer matrix plane. These circuits are called "readout circuits" in the rest of this document. This type of matrix is installed behind suitable optics that focus the infrared image of the observed scene on it. The resulting "thermal image" is converted into electrical signals that can be processed by the associated circuits.

The infrared radiation power per unit area actually used to increase the temperature of a unitary bolometer is equal to Pi.Ar.Fr: where Pi is the incident power on the total area of a pixel, Ar is the relative absorption in the useful area of the pixel, and Fr is the filling factor (useful area/total area). The temperature T in the useful part (variable with temperature) observable at equilibrium, i.e. at the end of a sufficiently long time under constant illumination, is equal to Rth.Pi.Ar.Fr; where Rth is the global thermal resistance between the sensitive (useful) area of the bolometer and its environment. Thermal losses for devices mounted under vacuum (negligible convection) are largely dominated by conduction along the mechanical parts connecting the detector to its support (readout circuit).

An instantaneous variation in the illumination level on the pixel being considered results in a temperature variation of $\Delta T$ achieved typically after $3\tau$ (set up at 95% of the new equilibrium value) where $\tau$=Rth.Cth, and Cth is the thermal capacity of the sensitive part.

In order to illustrate the influence of the various technological magnitudes characterizing the bolometer on the final performances of an elementary point, we can consider (among other possible arrangements) the case of a resistive bolometer continuously polarized under a polarization voltage Vpol (we are interested in the variation of the current under the influence of a variation of the illumination), and for which the readout uses a "chopped" mode, i.e. alternation between projection of the scene to be observed and a uniform and constant reference temperature (like the image of the blade of a "chopper"). The "photo" is made by projecting an element of the scene onto the bolometer (image point) at t=0. After a rise time to thermal equilibrium (typically $3\tau$), the current passing through the bolometer during time t is integrated in the form of a charge Q=t.Vpol/R. An image at the uniform reference temperature is then projected onto the bolometer (chopper blade) and after $3\tau$ (new temperature equilibrium) the current is again integrated in the same way and is compared with the previous signal by suitable electronic means in order to quantify the temperature rise in the element, and therefore the relative illumination received. It can be shown that in this embodiment, the noise equivalent power (NEP), equal to the smallest infrared power detectable by the device, is expressed as:

$$NEP=(1/Ar.Fr.Rth).(1/|TCR|).(q/Q)^{1/2}.(2ut/Vpol)^{1/2}$$

where ut=kT/q, namely 25 mV at ambient temperature. This relation is valid provided that the assumption that the noise in the bolometer is "white" is true, i.e. it is independent of the frequency and depends only to the bolometer resistance R0.

Therefore, we can see that the noise equivalent power reduces (the detector becomes more efficient) as the relative absorption increases, as the filling ratio and thermal resistance of the supports increase, and as the temperature coefficient TCR increases. In reading, the integratible charge, and the polarization voltage, should also be as high as possible. The polarization voltage is usually limited by an increase in the various noise factors, particularly in the bolometer itself, when the field in the structure increases. Therefore, the voltage behavior of the device without excessive noise is an essential quality.

The thermal capacity also defines the response rate of the bolometer, which is an important technological parameter since it defines the maximum readout frequency of the pixel, (fm=$\frac{1}{5}\tau$ in the example considered if t<<$\tau$) through the product Rth.Cth.

U.S. Pat. No. 5,021,663 and U.S. Pat. No. 5,367,167 describe two example embodiments of prior art.

FIGS. 1A and 1B schematically shows the concept developed in the first reference, and FIGS. 2A and 2B shows the concept developed in the second reference. Typically, an unitary microbolometer may be sub-divided into three main parts. Firstly there is the core of the device in which the temperature varies with the illumination (zone I in FIGS. 1A and 2A). This core is suspended using the supports which form the second part (zone II). Finally, zones III hold the assembly in position.

The layout and detail conformation of the various parts I, II and III shown in the linear form to simplify the description may in particular be adapted to a two-dimensional matrix layout in order to make compact photosensitive retinas for imagery. The "suspended" nature is due to the need for a very high thermal insulation, represented by the magnitude Rth, between the microbolometer and its environment.

A unitary microbolometer is typically represented in the form of a temperature sensitive element 10 (central zone I), supported by at least one (but more frequently two) supported element (zone II) which performs three roles:

it mechanically supports zone I;

it electrically connects the microbolometer terminals to zones III;

it thermally insulates the sensitive part 10 from zones III. The functions of zones III are:

to electrically and mechanically connect the assembly I and II onto the subjacent support 12;

to position the altitude of the bolometer plane when a reflecting layer is placed on the substrate surface to improve the infrared absorption (parameter Ar).

In FIGS. 1A and 2A, the bolometric material is reference 14. In FIG. 2A, there is also an electrical insulating layer 15 and a "absorbent" conducting layer 16.

It is necessary to provide a dedicated or integrated structure to make the optical absorption Ar of the bolometer as close as possible to 1. According to the laws of electromagnetism, this objective is achieved when the resistance of the equivalent layer (all layers put in parallel) of the microbolometer is equal to 377Ω/square (absorption independent of wave length λ) and if the precaution is taken of placing a mirror (reflector) at a distance λ/4 under the plane of the microbolometer to return the ray transmitted through the floating assembly to the microbolometer in phase with the incident ray, allowing for the phase rotation π at the metallic reflection. Typically this reflector, not shown in FIGS. 1A and 2A, is placed on the surface of the substrate/readout circuit 12. Care is taken to use appropriate technological means to make connections 11 with an appropriate height to hold the bolometer plane rigidly in position close to the specified distance. This layout gives a device with a selective wave length (maximum absorption at λ).

As already mentioned, the readout circuit 12, usually made on a silicon substrate using standard microelectronics techniques, is beneficially placed below the bolometer, particularly in the case of matrix structures with NxM points. Its role is firstly to provide polarization stimuli to the microbolometer (application of a voltage or current between two electrodes 13, 13'), and secondly to measure variations of the characteristics induced by the bolometer temperature rise under the effect of infrared illumination. The entire device is installed under a vacuum or at low pressure to prevent heat losses by convection, inside a sealed housing comprising an optical window on the front and electrical connections to the peripheral electronics.

With all manufacturing methods, zone I must have the lowest possible thermal capacity Cth, which is achieved by limiting the number of layers stacked in this zone to the essential minimum, their thickness to the functional minimum, and if possible by choosing materials with low specific heat capacity Cp. Zone II must have a maximum thermal resistance Rth, a negligible electrical resistance compared with that of zone I, and a low thermal capacity (to the extent that it forms a "heat sink" for zone I in which the temperature is to be varied). Zones III must provide electrical continuity between zones II and substrate 12, i.e. the electrical resistance must be negligible and the mechanical strength must be sufficient to keep the floating assembly I+II in position.

Zone I comprises essentially the temperature sensitive element 10. Typically, it comprises two conducting electrodes 13 and 13' in contact with the "bolometric" material, for which the resistance (or another electrical characteristic) varies with the temperature.

These electrodes may be parallel to the substrate plane, above and below the bolometric material which is surrounded like a sandwich. This configuration is shown in FIG. 1A. According to this first concept, the current resulting from the stimuli imposed by the readout circuit passes through the structure perpendicular to the plane of the device. In this case these electrodes are "solid", i.e. they occupy all or most of the surface of zone I. The bolometric material may be made of slightly n or p doped amorphous silicon, or any other material for which the conductance or the dielectric susceptibility or the polarization (since the configuration is clearly that of a capacitor) varies with the temperature, for example close to ambient temperature.

In this first configuration, the resistance of the global layer to optimize optical coupling (absorption Ar) is obtained by adjusting the resistance of the two electrodes 13 and 13' close to 750Ω/square, since there are two conductors in parallel in the optical sense.

In another configuration illustrated in FIG. 2, the electrodes 13 and 13' are coplanar and constitute simple lateral contacts located along two opposite sides of zone I and typically only occupy a small part of this zone. The current in the structure then passes parallel to the plane of the device. This second configuration is better adapted to the use of slightly n or p doped amorphous silicon for use as a bolometric material since the electrodes are inherently much further apart. However, optical coupling (Ar) cannot be obtained with amorphous silicon only, since its resistivity is much higher. This optical coupling is then obtained by adding a specific conducting layer 16 of 377Ω/square, electrically insulated from the body of zone I by a dielectric layer 15.

The concept illustrated in FIG. 1 (U.S. Pat. No. 5,021,663) has the following disadvantages:

Field of application limited to materials with high resistivity, typically $>5.10^5$ Ωcm (500 Ωm) to obtain a resistance Ro of the order of 1 MΩ (0.1 μm of thermosensitive material, area 50 μm×50 μm). The result, at least for the case of amorphous silicon, is that there are some difficulties in controlling the manufacturing process.

Structures of this type usually have non-linear, or highly non-linear, voltage-current characteristics for polarization exceeding a few hundred millivolts, since the thickness of the thermosensitive layer must be low (sub-micronic) in order to limit the thermal capacity of the assembly. These low thicknesses are usually accompanied by conduction phenomena dominated in particular by the interfaces, which are typically noisy and non-linear. This characteristic is related to the very small spacing between the two electrodes, and reduces the imagery performances of the retina. Under some conditions, materials such as doped amorphous silicon or vanadium oxides may have acceptable linearity, but only at low polarization voltages Vpol which tends to reduce the performances in terms of the signal/noise ratio by signal attenuation.

The electric noise produced by this type of structure usually tends to increase quickly when the polarization voltage increases, due to the appearance of other noise mechanisms such as "white noise" related to the value of the resistance. The result is that, even if working in a non-linear zone is acceptable (at high voltage to increase the signal), the signal/noise ratio deteriorates due to the increased noise.

The manufacturing process is complex (at least 5 masking levels) since electrodes 13 and 13' are independent, such that regardless of the assembly methods used, a lithographic level and associated operations are necessary to ensure continuity of contacts in zones III, on 13 and 13' respectively. Furthermore, at least three layers are necessary to make the structure (electrode 13/bolometric material/electrode 13'), resulting in a large number of manufacturing operations, and consequently eventually a high cost (number of operations/efficiency).

Some processes have vital critical characteristics which affect the potential efficiency compared with the functionality of the device; etching of the connections located in zones III, etching of the electrode 13', peripheral cross-linking etching, integrity of very thin layers sandwiched between two non-equipotential conductors. All these characteristics are potentially sources of electrical leaks between electrodes, themselves sources of signal disturbances (level dispersions in the matrix structure) and/or excess noise.

The infrared absorber function necessitates two layers of metal with resistances per layer of 750Ω/square, which is difficult to achieve and control with normally used metals, and which also must have good contact characteristics on the bolometric material. For example, titanium nitride (TiN) has high resistivities, typically 100 to 300 $\mu\Omega$ cm (0.0000001 to 0.0000003 Ωm) usually depending on the process used. The required thicknesses vary from 13 to 40 Angstroms (4.0 nm) depending on the resistivity, and much less with normally used metals (titanium, chromium, etc.).

The pattern of inter-connection zones III occupies a relatively large surface area (two vias+clearances and miscellaneous spaces) to the detriment of the filling factor Fr.

The concept shown in FIG. 2 (U.S. Pat. No. 5,367,167) has the following disadvantages:

The large spacing of bolometer electrodes, practically equal to the repetition pitch in the matrix structure, at constant thickness of the thermo-sensitive material (this thickness is dictated by the constraint on Cth, i.e. minimum) implies a relatively low resistivity of this material in order to give a resistance level Ro appropriate for coupling with the readout circuit. In the case of amorphous silicon, this means a relatively low dR/Rdt coefficient. Therefore, the performances of this approach are limited.

Due to the very large space between the two electrodes, the infrared absorber function requires a metallic layer over the entire sensitive surface, together with a dielectric insulating layer to prevent a short circuit with the active electrodes. The resulting total thickness of stacked materials is high (1500 to 2500 Angstroms (150 to 250 nm) of miscellaneous materials), resulting in a high thermal capacity of the sensitive zone.

The insulation statistics (i.e. the physical integrity) of the passivation layer (necessarily very thin) between the infrared absorber and the temperature sensitive material, defines the functional efficiency of the devices. Therefore, the deposit of this layer is a critical step.

Manufacturing is complex (6 masking levels).

Interconnections to the readout circuit require a non-negligible surface area (two vias+a space between connections). The filling ratio Fr is correspondingly reduced.

Compared with existing resistive bolometers which do not have a linear current/voltage relation at high voltage and are naturally noisy (devices with parallel electrodes) or which in addition to their electrodes, comprise a metallic layer in another plane to perform the radiation absorption function (devices with coplanar electrodes), the purpose of the invention is a resistive bolometer type infrared detector with coplanar conducting elements that can perform the function of electrodes and radiation absorption, while keeping the current/voltage relation linear and maintaining a low noise level even at high voltage.

Furthermore, this invention can make use of higher performance (more resistive) bolometric materials, using a simpler technological assembly.

DISCLOSURE OF THE INVENTION

This invention relates to an infrared detector comprising:
a sensitive part comprising:
  a sensitive element comprising a layer of material in which the resistivity varies with the temperature,
  conducting elements carrying out the functions of electrodes for the said detector and infrared absorber;
at least one support element for the sensitive part capable of positioning the said sensitive part, electrically connecting it to a readout circuit and thermally insulating it from the rest of the structure; characterized in that all conducting elements are placed on the same surface of the layer of temperature sensitive material.

According to a first embodiment, the conducting elements comprise two interleaved electrodes, simultaneously performing electrode and absorber functions, these electrodes being connected to the readout circuit.

According to a second embodiment, the conducting elements comprise two electrodes of a first type connected to the readout circuit and at least one electrode of the second type raised to a floating potential, the electrode of the second type performing the absorber function only and the electrodes of the first type simultaneously performing the electrode and absorber functions.

Beneficially, there are at least two conducting elements making the electrical connection to the readout circuit.

According to a first alternative, the said surface of the layer of sensitive material is the lower surface, the conducting elements being placed under the said layer.

According to a second alternative, the said surface of the layer of sensitive material is the upper surface, the conducting elements being placed on the said layer.

According to a third alternative, the conducting elements are located between two layers of sensitive material, i.e. in contact with the upper surface of the first layer and the lower surface of a second layer of sensitive material.

Beneficially, the temperature sensitive material is doped amorphous silicon. It may also be a vanadium oxide.

Beneficially, the free space defined between the conducting elements is composed solely of a temperature sensitive material.

Beneficially, a reflector is provided on the surface of the substrate supporting the readout circuit, and located $\lambda/4$ under the plane of the sensitive element, where $\lambda$ is the radiation wave length R for which the bolometer is preferentially sensitive.

Beneficially, the pattern of conducting elements is repeated at a pitch typically between $\lambda$ and $\lambda/2$ to obtain average absorption exceeding 90%; for example for detection in the 8–12 μm band, the electrode pitch is less than or equal to 8 micrometers to prevent the cutoff effect of "short" wave lengths (8 to 10 μm), with a length of 5 μm or more, to prevent polarization effects.

Beneficially, each support element comprises at least one connection pillar and at least one thermal insulation arm.

The invention also relates to a detector composed of a set of unitary detectors as defined above.

The invention also relates to a process for manufacturing an infrared detector, characterized in that it comprises the following steps, starting from a readout circuit previously made from a substrate:

a) formation of a sacrificial layer;
b) deposit of at least one conducting layer to make the conducting elements;
c) making of at least one contact opening to the readout circuit by local etching of the conducting layer and the sacrificial layer;
d) deposit of at least one conducting material and etching of this material in order to form the electrical connection between conducting elements and the readout circuit, the pattern thus being formed making up the support pillar;
e) etching of the conducting layer deposited in step b), in order to define the patterns of the conducting elements;
f) deposit of the temperature sensitive material onto the assembly, and etching of the various layers placed above the sacrificial layer in order to define the sensitive element and the support arm;
g) etching of the sacrificial layer so as to release the sensitive part and the pillar.

Obviously, the order of the previous steps may be modified, and in particular according to another embodiment, step f) depositing the sensitive material may be done before step b), the sensitive material then being etched in step c).

According to another embodiment, the sensitive material is deposited as a first layer before step b), and as a second layer in step f), the first layer of sensitive material then being etched in step c).

Furthermore, depending on the material used in the conducting layer in step b), step d) may be done before or after this step b).

A pillar is any element capable of supporting the sensitive part from the support arm, regardless of its geometry.

In one beneficial embodiment, a metallic layer is deposited and etched before step a), to form a reflector.

According to another beneficial embodiment, the sacrificial layer is a layer of polyimide that has been annealed.

According to another beneficial embodiment, the conducting layer in step b) is a dual layer of titanium nitride and aluminum, the conducting material in step d) then being deposited after carrying out steps b) and c), this conducting material and the aluminium then being etched in the same way as in step d).

According to another beneficial embodiment, the conducting material in step d) is a multilayer, in which at least one of the layers is formed by LPCVD.

According to one embodiment, the conducting elements have a first and second surface, the sensitive material being in contact with one of the surfaces of the said elements, the other surface being put in contact with a layer of passive material.

According to another embodiment, a layer of passive material is also deposited on the surface(s) of the sensitive material, not in contact with the conducting elements.

Finally, according to another beneficial embodiment, the passive material is chosen as being either silicon oxide, silicon nitride or amorphous silicon.

The main advantages of the detector according to the invention are as follows:

This embodiment is as simple as possible, and therefore its technological efficiency is potentially high, for two main reasons:
the number of layers and therefore of lithographic levels to define its contours, is minimum;
the presence of a single conducting layer (device with coplanar electrodes without a metallic counter-layer) eliminates the technological criticality of all the materials and processes described above.

The total thermal capacity Cth of the sensitive part is minimized due to the necessary use (in the simplest version) of two superposed layers in the sensitive zone only; one layer sensitive to temperature and essentially continuous, and a conducting layer typically occupying only part of the surface area of this zone.

Especially, it is easily possible to improve the performances of the detector compared with prior art simply by the design of the conducting patterns in the sensitive zone, by using materials with a higher resistance (with a higher TCR in the case of amorphous silicon), or to adjust the resistance Ro of the detector for a material with a given resistivity, which is another way of improving the device.

A first method of making these conducting patterns is to define two electrodes in the form of interleaved combs covering the main part of the surface of the sensitive zone.

The temperature variation coefficient TCR may then be optimized, while maintaining a linear current-voltage characteristic since it is intrinsic to devices with coplanar electrodes. This optimization may be obtained by reducing the spacing between the two electrodes, provided that some precautions about optical absorption are taken as described below, in order to enable the use of materials with higher resistance (with a higher TCR in the case of amorphous silicon), with constant R0 (imposed by Q at constant Vpol). Another way of making use of this electrode arrangement is to increase the polarization voltage Vpol, while maintaining the same electrode design, thickness of sensitive material and Q, by correspondingly increasing the resistance R0, in other words by using a material with higher resistance (for example by suitably doping amorphous silicon) which tends to increase TCR in the case of amorphous silicon.

A second way of making metallic electrodes consists of only connecting two conducting elements occupying only a part of the surface of the sensitive zone. These two elements form the actual electrodes of the device. Other conducting elements are allowed to float electrically on each side of these electrodes.

The resistance Ro seen between these two electrodes may vary very significantly (typically by a factor >60 to 600 for a lithographic definition of 3 μm and 1 μm respectively and a detector size of 50×50 μm) between the various ways of making these patterns, for the same thickness and resistivity of the sensitive material. This intrinsic property of the invention provides the designer with considerable degree of freedom in optimizing coupling of the detector to the readout circuit without making any technological modifications, or adjusting the resistivity of the sensitive material which may be inaccessible.

Accessorily, the filling factor is optimized by the use of a very compact method of electrical and mechanical connection to the readout circuit, which comprises one (or more frequently two) pillar(s) per elementary point (or unitary detector). Some embodiments are capable of making connections with better mechanical characteristics than are possible using the state of the art, by a symmetrical layout of the layers. The main consequence is better positioning statistics of the sensitive plane with respect to the reflector and therefore a more uniform response for a set of dectectors.

DETAILED PRESENTATION OF EMBODIMENTS

The invention consists of a device made using a single conducting layer in which patterns are defined corresponding to the conducting elements, using a single lithographic level. According to the invention, these conducting elements may be made in two different ways. FIGS. 3A, 3B and 4A, 4B show a first embodiment of the conducting elements. In this embodiment, these elements are made in the form of two interleaved combs simultaneously performing the functions of the microbolometer electrodes, infrared absorber and electrical connection to the readout circuit. This structure is particularly, but not exclusively, applicable to the use of slightly doped amorphous silicon as the temperature sensitive material.

Figure 1A:
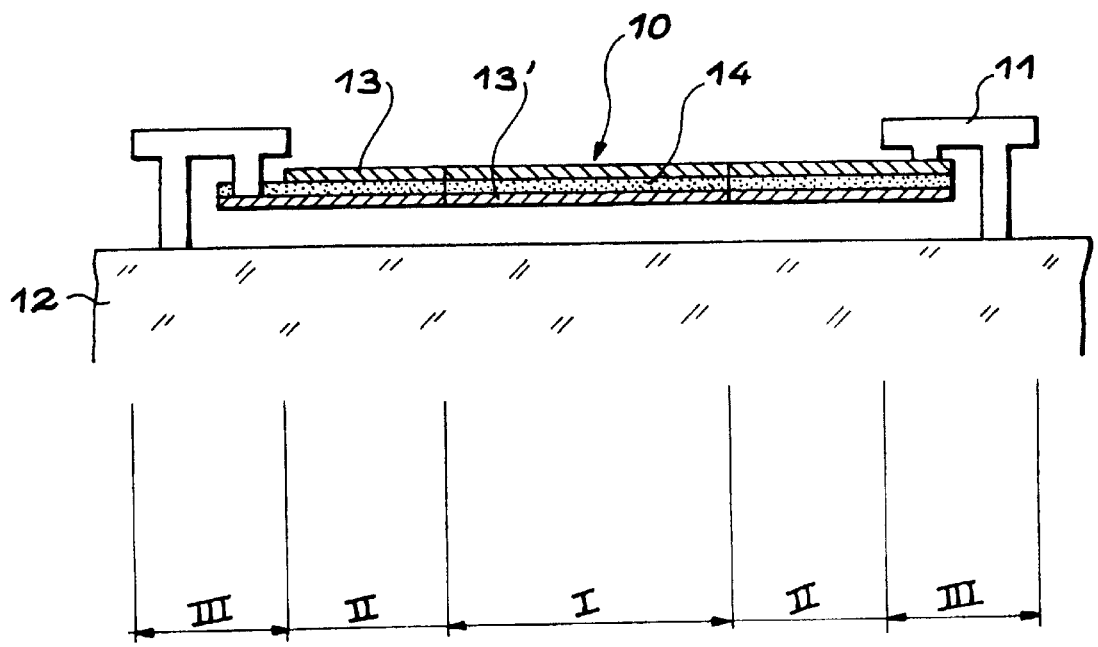
FIGS. 1A and 1B illustrate a first example embodiment of a detector according to prior art, showing a view parallel to the plane of the substrate and a top view respectively.
Figure 1B:
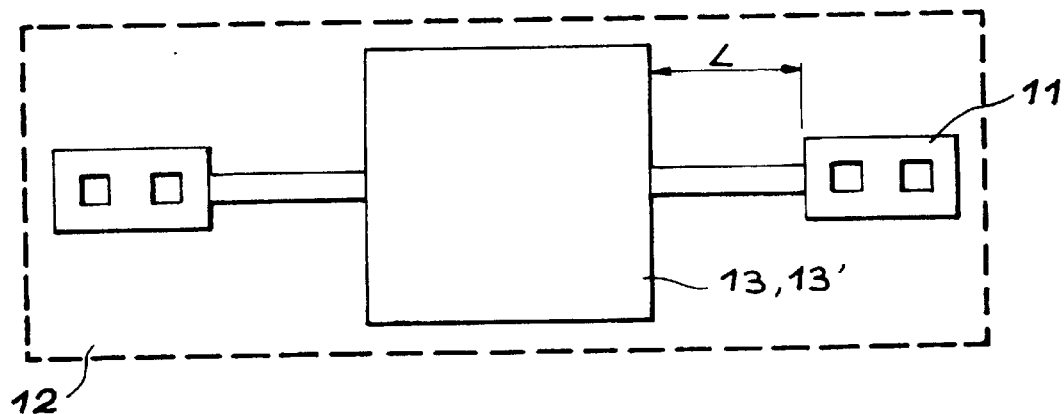
Figure 2A:
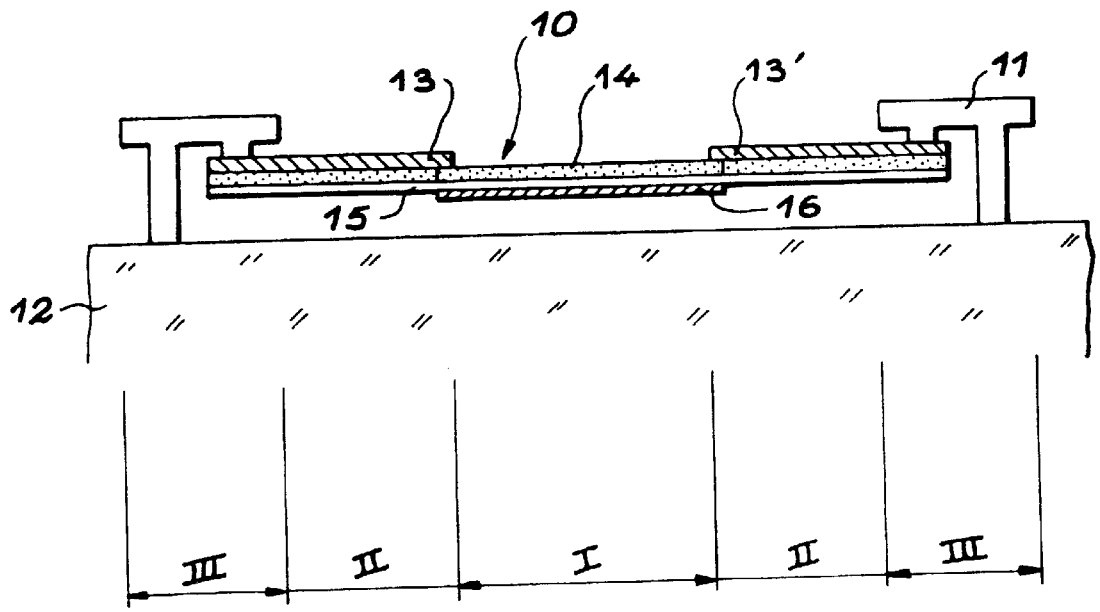
FIGS. 2A and 2B illustrate a second example embodiment of a detector according to prior art, showing a view parallel to the plane of the substrate and a top view respectively.
Figure 2B:
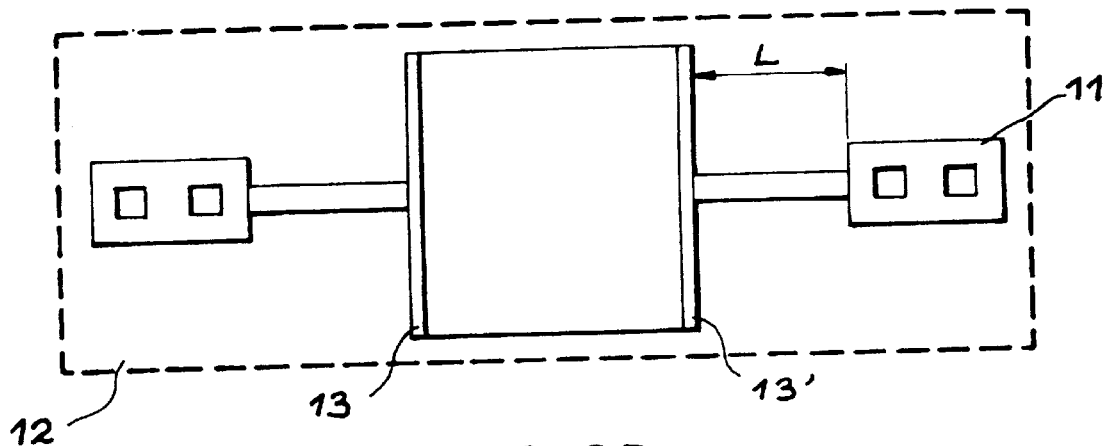
Figure 3A:
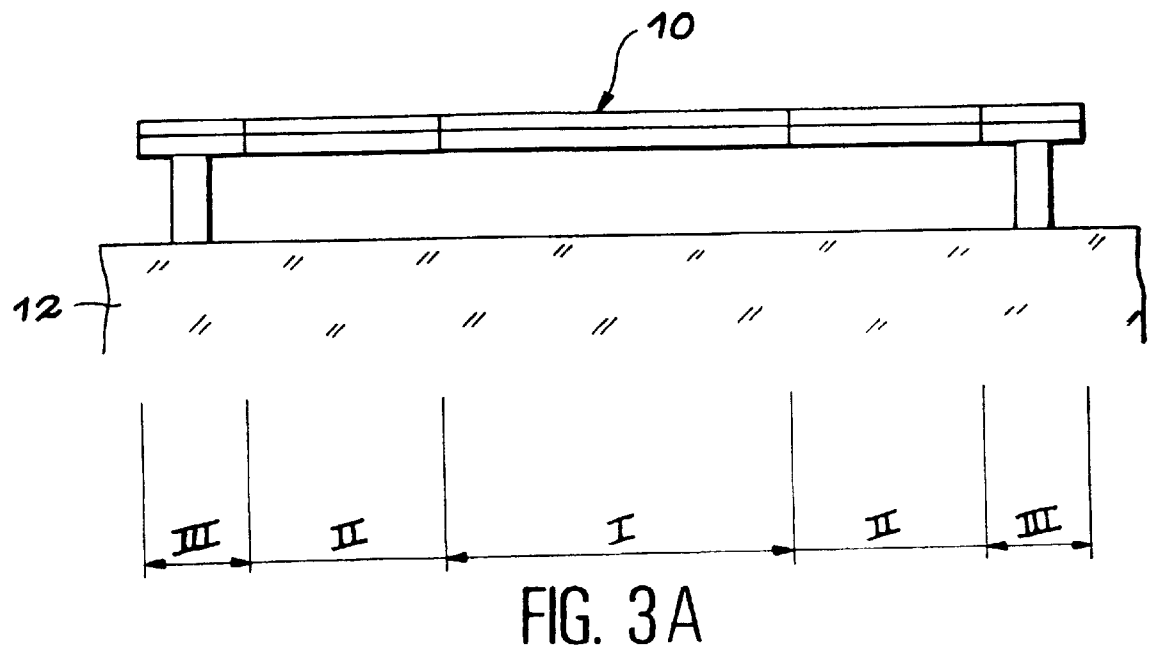
FIGS. 3A and 3B illustrate the general design of the detector according to a first embodiment of the invention, showing a view parallel to the plane of the substrate and a top view respectively.

More precisely, the device according to the invention shown in FIG. 3A includes a zone I comprising two conducting electrodes 13 and 13' in the form of interleaved combs on the surface; these combs 13 and 13' may have the shapes illustrated in FIGS. 3B, 4A, 4B and 5A, 5B.

Zone I of sensitive part 10 is the temperature sensitive zone. It also comprises a layer of "bolometric" material, the resistivity of which varies with temperature. This layer may be made of n or p doped amorphous silicon (a-Si:H).

According to the invention, the two conducting electrodes 13 and 13' in the form of interleaved combs perform two distinct functions, unlike layouts used in prior art: they act as electrodes and as absorbers. Furthermore, in this embodiment, it is possible to optimize the free space defined between these two electrodes 13 and 13', which can be beneficially composed solely of a temperature sensitive material (using the simplest embodiment). It beneficiously has a minimum length and maximum width, so as to enable the use of a material with the highest possible resistivity (with constant R0) to maximize dR/RdT (the length and width are defined relative to the direction of the current passing from one electrode to the other). For example in a $50\times50\,\mu m^2$ elementary point, and for a lithographic resolution of two micrometers and simplifying, it is possible to define a space two micrometers long and (12×50) micrometers wide, giving a global resistance of the layer of 1/300 square; this is the resistance seen between two linear electrodes placed on two opposite sides of the elementary point with its side equivalent to a square. The gain for a lithography with a one resolution of micrometer is therefore 300 on the resistivity of the material with equivalent resistance R0 (value in the dark) of the elementary point.

Furthermore, absorption of infrared radiation received by zone I of the sensitive part 10 depends on the resistance of the equivalent layer in this zone I and whether or not there is a reflector on the surface of the substrate 12. According to the state of the art, it is useful to provide a reflector of this type to return energy that passes through zone I of the sensitive part 10, towards the sensitive zone. Under these conditions, an absorption close to 100% is obtained at a wave length close to 10 micrometers, for a space close to 2.5 micrometers (quarter of a wave length) between the reflector and the plane of the sensitive element, for a layer resistance of close to 380Ω/square in this same zone. There is a detailed analysis of these optical effects in an article by K. C. Liddiard, Infrared Physics, vol. 34, No. 4, pages 379–387, 1993. Taking account of the high resistivity of materials typically used in bolometry, the resistance of the equivalent layer in zone I of the sensitive part 10 is equal to the resistance of its component conducting layer(s) in parallel. The thickness of this (these) layer(s) must be minimum (optimization of Cth of zone I) and Rth of zones II, while remaining technologically practical, i.e. controllable and reproducible. The comb shaped electrodes according to the invention perform this role of infrared absorber in a single layer, beneficially associated with a single definition lithographic level.

The design of the interleaved electrodes should be optimized to obtain the best possible optical efficiency.

Figure 6:
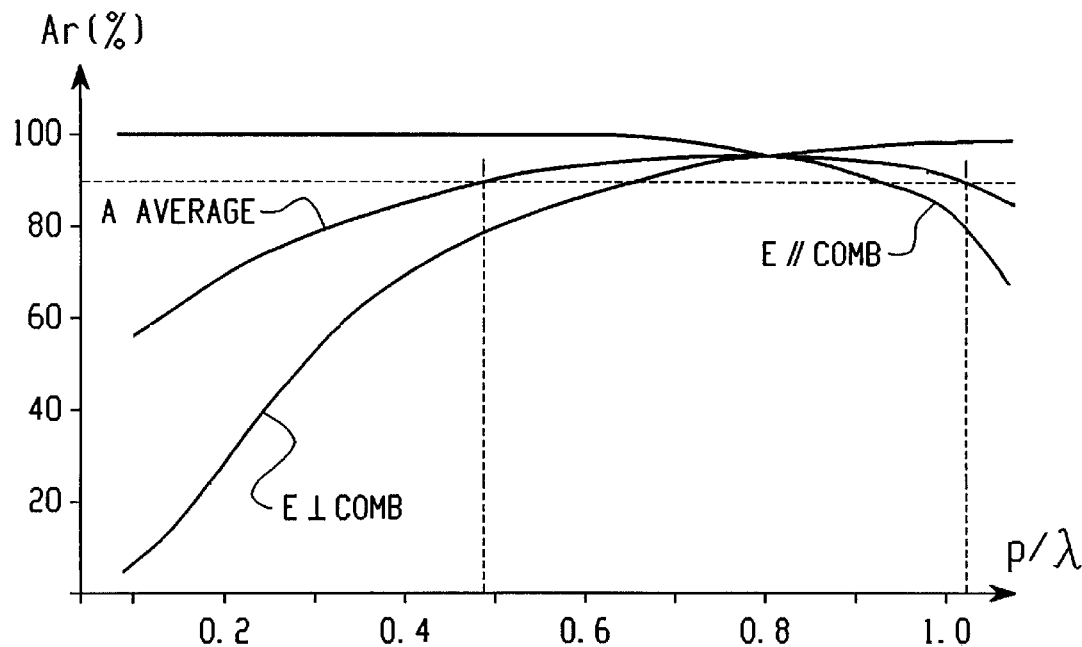
FIG. 6 shows a simulation obtained using the Maxwell equations for relative absorption Ar as a function of the p/λ parameter (pattern pitch/wave length)

FIG. 6 illustrates a simulation made using Maxwell's equations for relative absorption Ar as a function of the parameter p/λ (pattern pitch/wave length) for an infinite pattern along the two dimensions normal to the incident ray, composed of an alternation of conducting elements of width d at a spacing of e (p=d+e). This calculation is made for incident radiation normal to the bolometer surface, for which the electrical field is parallel (E//) or perpendicular (E⊥) to the large dimension of conducting elements as shown in FIG. 7.

Figure 7:
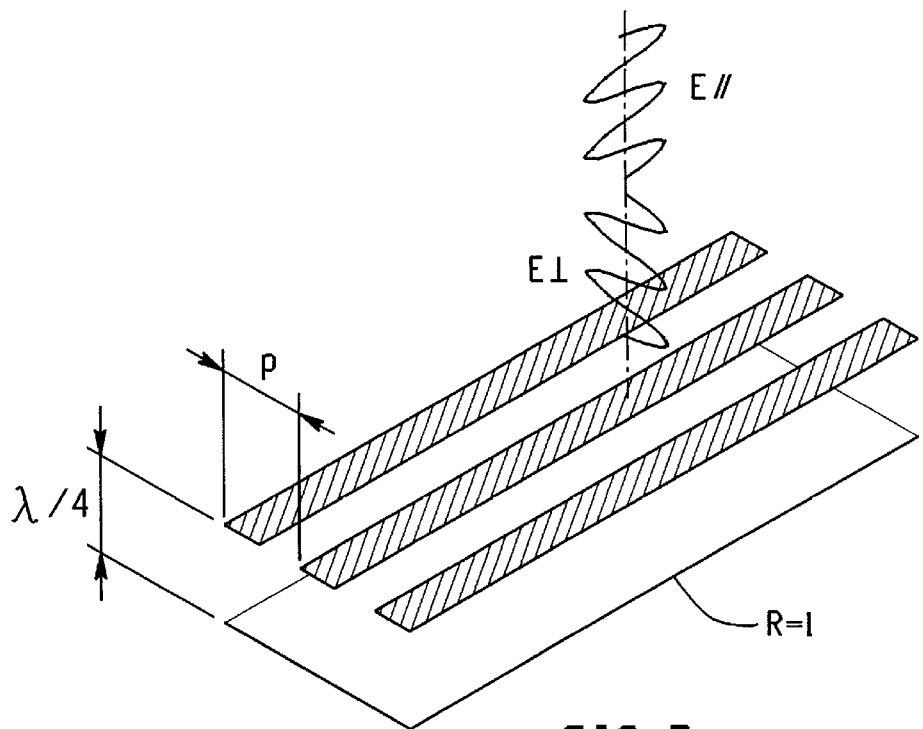
FIG. 7 illustrates radiation types and the electrical field used in the simulation in FIG. 6.

Thus in FIG. 7, the simulation assumes firstly the presence of a reflector located at λ/4 under the plane of the bolometer and an optimum value of the resistance of the equivalent layer of the metallic pattern $Rsquare_{eq}$#380Ω/square.

We will now consider three possible cases in sequence:

Case 1:

The electrical field of the incident radiation is parallel to the large dimension of the patterns (E//).

When p<<λ, the pattern behaves like a continuous layer with an equivalent square resistance equal to $Rsquare_{eq}=Rsquare_{metal}\cdot p/d$, and the absorption is close to 100%.

When p=μ, the absorption is still approximately equal to 80% and then drops quickly due to the diffraction effect.

Case 2:

The electrical field of the incident radiation is perpendicular to the large dimension of the patterns (E⊥)

The relative absorption is low for p<<λ (extinction by polarization effect), and then increases quickly with p, and when p>λ/2 we obtain Ar>80%; the maximum absorption is achieved at p=λ (resonance effect due to the quarter wave length cavity).

General case:

The orientation of the electrical field of the incident radiation is random compared with the electrode pattern. The average relative absorption, A average (rms) has an intermediate value between the first two curves. When 0.5λ<p<λ, Ar>90%, the rms global optimum is close to a pitch of 8 micrometers to maximize the average absorption of radiation at 10 μm.

Therefore, the pattern of the conducting elements simply needs to be repeated as a pitch typically between λ and λ/2 to give an average absorption greater than 90%. However, in the case of infrared detection in the 8–12 micrometer atmospheric band, the fast reduction in absorption by the diffraction effect when p>λ can justify an element pitch p≦8 μm, to avoid the cut off effect of short wave lengths (8 to 10 μm).

Figure 3B:
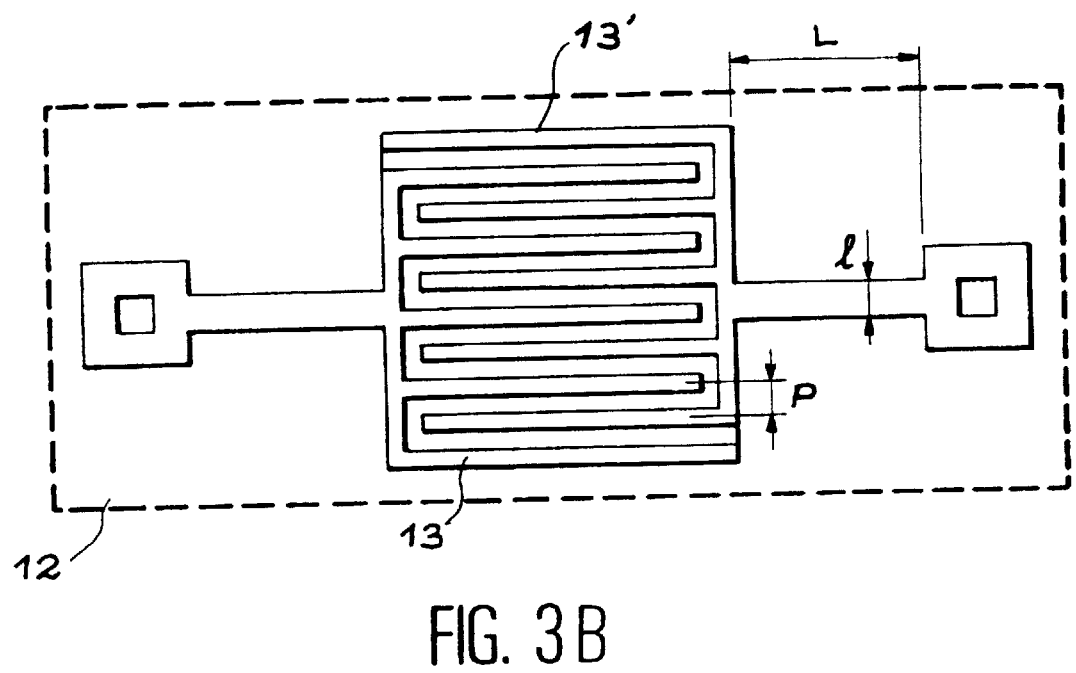

The electrode design shown in FIG. 3B, which is a simple network of strips at a pitch of between five micrometers and eight micrometers, complies with this criterion for detection between 8 micrometers and 12 micrometers in a 50 μm×50 μm sensitive surface area. The balanced solution d/e=1 may be used, i.e. with 2.5 micrometer wide pins at a spacing of 2.5 micrometers, up to 4 micrometer wide pins at a spacing of 4 micrometers, with a comparable result in terms of absorption for a wave length close to of 10 micrometers.

The equivalent resistance for electrodes placed at a pitch of 5 micrometers with p/d=1 is equal to about $Rsquare_{bolo}/200$ regardless of the shape of the interleaves, where $Rsquare_{bolo}$ is the resistance of the layer of bolometric material. In particular, a comparable value is obtained for the "telegraph pole" shaped design in FIG. 4A, except for peak effects. This type of design does not have a more severe polarization effect.

In order to make optimum use of the proposed concept of closely placed coplanar electrodes in the detector according to the invention, the inter-electrode spacing can typically be reduced to about 1 micrometer without introducing any inconvenience due to the non-linearity of the current/voltage characteristic, up to a few volts of polarization (Vpol). However FIG. 6 shows that it is important to avoid patterns that have a small pitch compared with the wave length in one direction only, since a polarization effect will be introduced.

Figure 4A:
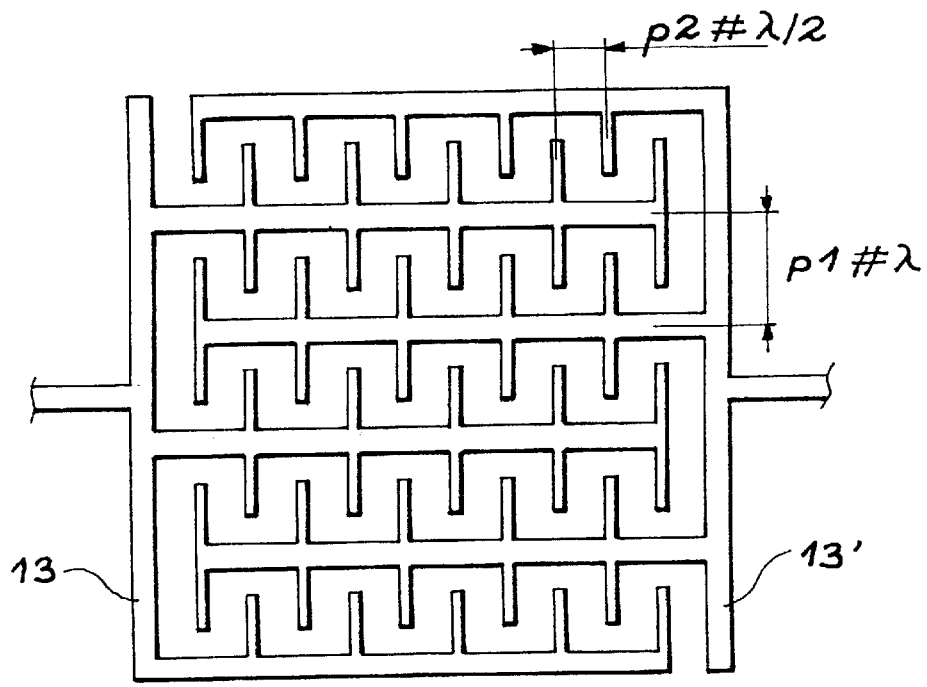
FIGS. 4A and 4B illustrate two other example embodiments of electrodes of the detector according to the invention illustrated in FIG. 3.
Figure 4B:
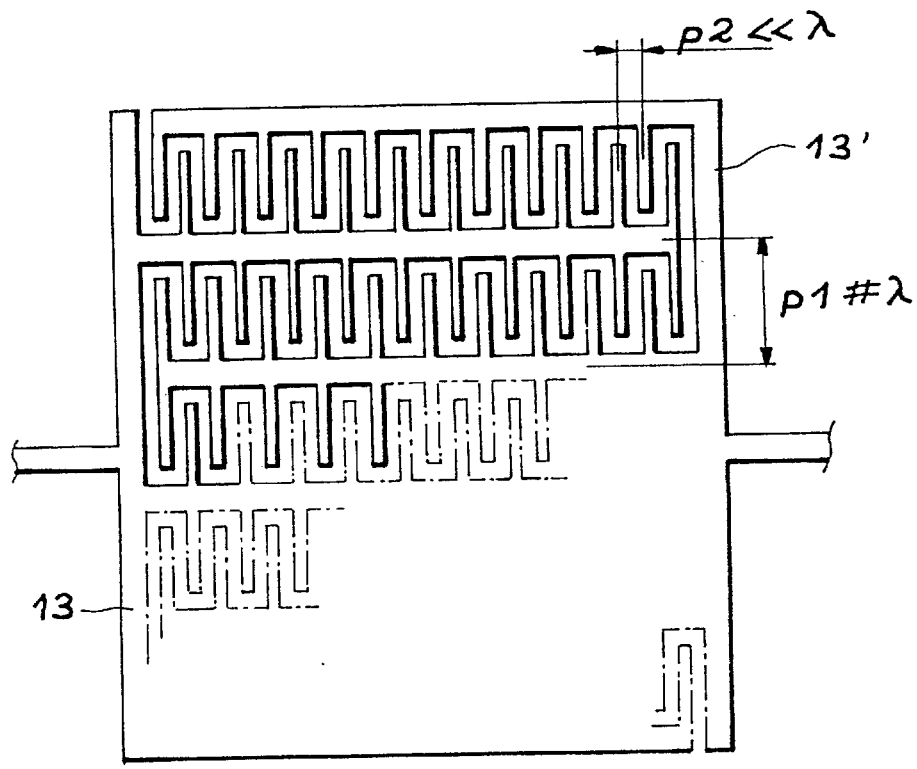

FIG. 4B shows an example embodiment of "telegraph pole electrodes" in accordance with this criterion, enabling pitches of the order of 2 micrometers or less without any prejudicial polarization effect. "Collectors" are made in a horizontal direction on the diagram with a pitch p1 close to or a little less than λ in order to absorb infrared photons with polarization "horizontal" with respect to the drawing. In the other direction, a significantly smaller pitch p2 is possible, providing absorption of infrared photons with "vertical" polarization. The resulting resistance Ro of a 50 μm×50 μm bolometer for a pitch p1 of 2 micrometers with p1/d #1 between electrodes is of the order of $Rsquare_{bolo}/400$ to 500. Materials with even higher TCR can then be used at a given resistance R0.

In principle, the same d/e ratio should be used in both directions if the electrode is obtained in a single operation (a single conducting layer). However, the attenuation of the absorption when $Rsquare_{eq}$ is not close to the optimum value of about 380Ω/square is slow, and in practice it is possible to tolerate a variation of +/− 40% without losing more than 10% on the absorption. Therefore, it is easy to adjust the distribution of conducting zones and spaces to best satisfy the criteria mentioned above.

Figure 5A:
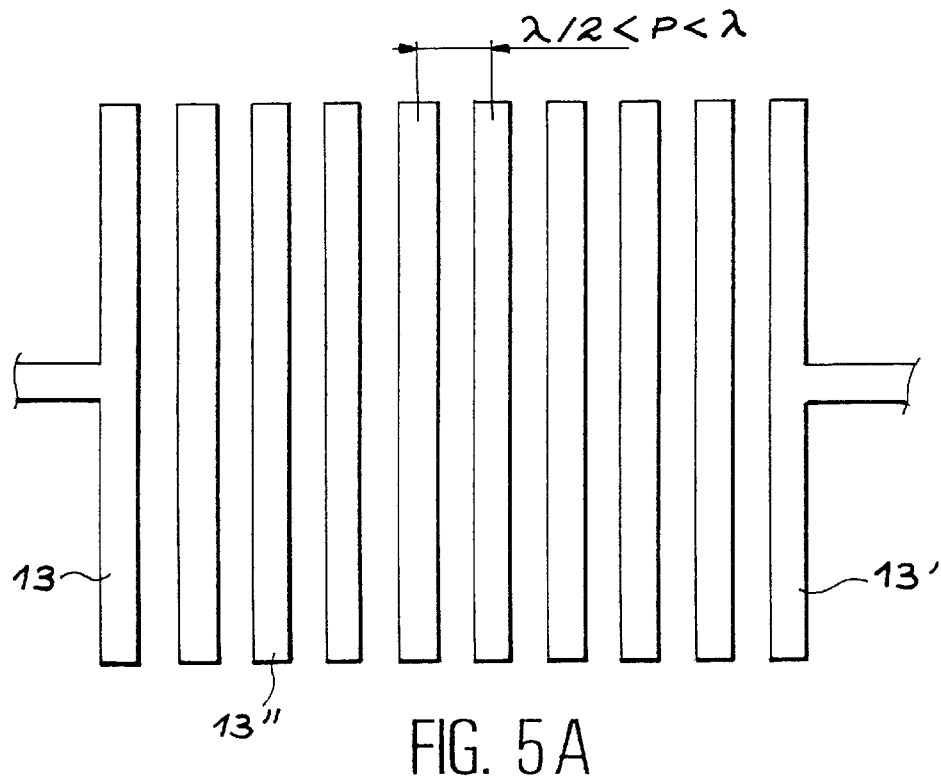
FIGS. 5A and 5B illustrate a second embodiment of the detector according to the invention.
Figure 5B:
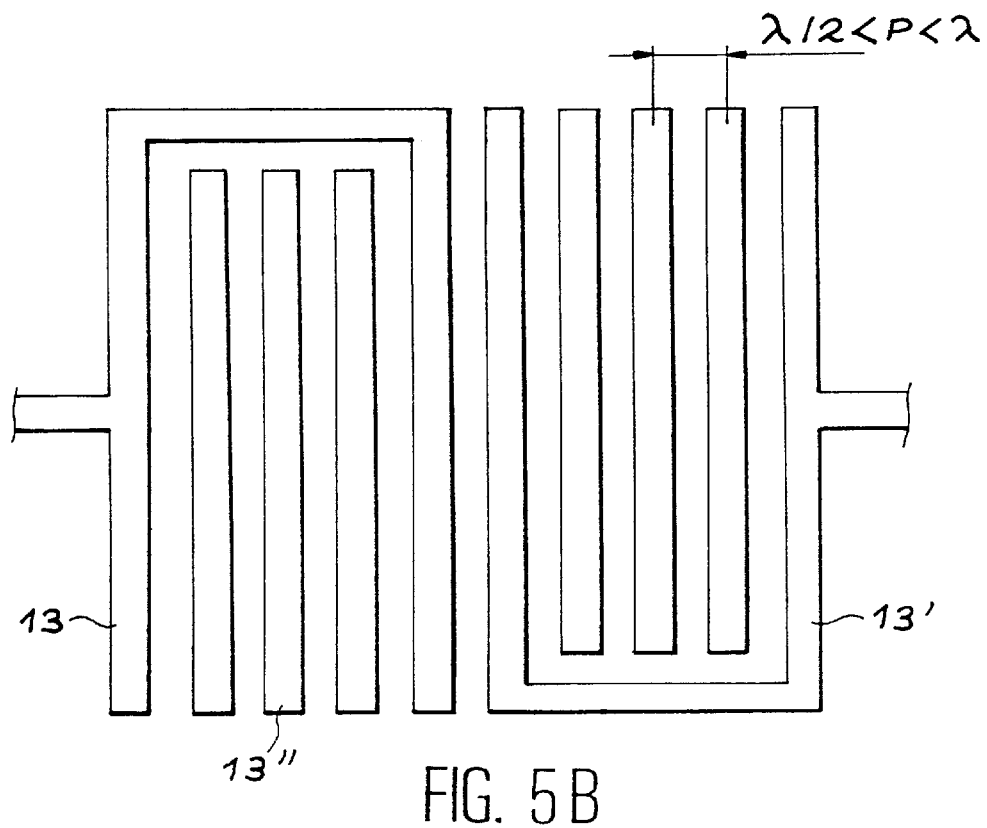

FIGS. 5A and 5B show examples of the second embodiment of conducting elements in the sensitive part of the detector. These elements are defined using a large number of discontinuous patterns, at least two of which are connected to the readout circuit and form the electrodes 13 and 13' themselves, the other patterns 13" not being connected. In FIG. 5A, the patterns 13" are straight line conductors and in this example there are eight of them parallel to each other and parallel to electrodes 13 and 13'. These patterns are separated by a pitch p such that λ/2<p<λ. In the example in FIG. 5B, the electrodes 13 and 13' are in the shape of a "U" inside which are located the patterns 13", which are also straight line conductors parallel to the two outside legs of the "U", the spacing p between these conductors also being λ/2<p<λ. Thus, as in the first embodiment, the electrodes 13 and 13' perform the twofold function of electrodes and absorbers, whereas elements 13" only act as absorber. Thus, all characteristics concerning absorption of the conducting elements described above are also applicable to this embodiment.

The second embodiment enables greater flexibility in adjusting the resistance Ro due to the possibility of connecting two very distant elements to readout circuits as shown in FIG. 5A, or to very close elements as shown in the case in FIG. 5B. This enables optimization of coupling with the readout circuit.

Thus, according to this second embodiment shown in FIG. 5A, it is possible to use materials with relatively low resistivity, for example such as vanadium dioxide $VO_2$, under optimum conditions, while maintaining the advantages of technological simplicity and immunity to defects in the materials making up the device specific to the invention. It is necessary to achieve a high resistance Ro (typically several MΩ) in order to limit the temperature rise in the detector due to the Joule effect under the effect of reading stimuli, or more simply the global consumption of the device during operation.

FIG. 5B and various alternatives of it that will be obvious to those skilled in the art, can be used to make resistances with intermediate values depending on the optimization objectives required. Unconnected patterns naturally balance each other during operation at intermediate potentials between the potentials of the connected electrodes 13 and 13' (without disturbing the detector characteristics) in accordance with the principle of the dividing bridge.

Thus, the fact of providing infrared absorber functions and electrodes made of temperature sensitive material in a single conducting layer according to the invention, very much simplifies the technological process, firstly because only one lithographic level associated with a single etching operation is necessary. Secondly, a layer resistance close to 380Ω/square is obtained with a greater thickness of conducting material, without increasing the total mass, which improves the practicality of the deposit process. If the absorber is made using two continuous layers in parallel according to one possibility according to prior art, these two layers must have a resistance of about 750Ω/square which requires thicknesses that are difficult to control with even relatively resistive metallic materials such as titanium nitride; typically, 15 to 40 Angstroms (1.5 to 4.0 nm) per layer are obtained assuming a resistivity of 100 to 300 μΩ cm, (0.0000001 to 0.0000003 Ωm) which are typical values depending on the deposit process. Similarly, using another version according to prior art which requires a single continuous layer, a double thickness is necessary (30 to 80A in the case of titanium nitride), which is not very practical in most cases. According to the solution proposed in the invention, a thickness close to (ρ/380).(p/d) has to be deposited, i.e. 60 to 160 Angstroms (6.0 to 16.0 nm) for d=p/2, or 90 to 240 Angstroms (9.0 to 24.0 nm) for d=p/3. These thicknesses are reasonably easy to achieve and to check, the proposed p/d values should be considered as being typical.

Those skilled in the art will also appreciate the advantage of structures with coplanar electrodes, concerning immunity to short circuits between the two electrodes. Isolated integrity defects in the thermosensitive layer ("pinholes") have no consequence in this layout. Furthermore, the presence of a continuous conducting layer electrically isolated from the thermosensitive material according to some forms of prior art, also makes the manufacturing efficiency sensitive to the density of defects in this insulating layer. However, this insulating layer is unnecessary according to the invention. The proposed configuration in the invention is therefore intrinsically robust to defects in the materials used.

The expert in the field will also appreciate the specific advantage concerning immunity to short circuits between electrodes, provided by the shapes of the invention as shown in FIG. 5A. A random defect in the lithography of conducting zones will usually put two floating elements into short circuit, without short circuiting the two connected electrodes. The result is a change in the resistance Ro, but the elementary point will usually remain operational.

Zones II have two main functions:
  to mechanically support the body of the floating device 10 above the readout circuit;
  to electrically connect the electrodes made in zone I to the metallic terminals of the readout circuit, rigidly attached to substrate 12.

According to the state of the art, these support/insulation arms may beneficially be cut out from the assembly of layers forming the central part I, based on a pattern of length L and width l. By construction, the thickness is identical to that in zone I. The length of these patterns must be maximized, and the width and thickness must be minimized in order to maximize Rth.

Figure 14A:
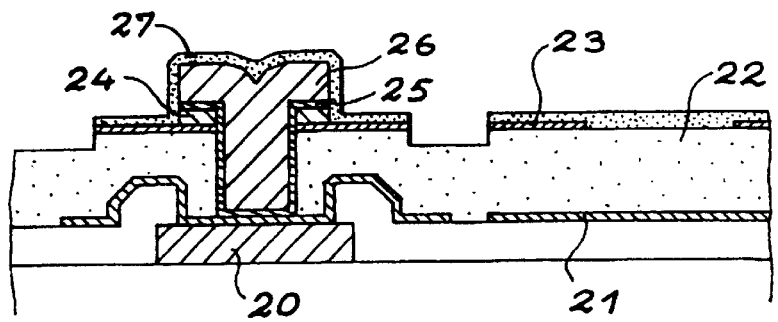

However, a reasonable compromise must be found for reasons related to mechanical stiffness and particularly geometric deformations (due to release of internal stresses in the various component materials when the structures are released). It is necessary to control the space between the body of the bolometer and the reflector to benefit from the quarter wave length over the entire detector surface, and the slightest deformation of the support arms will introduce a variation in this space. A lateral cut out of length L equal to one or two sides of an elementary point or pixel, namely 40 to 80 useful micrometers for a 50 μm×50 μm pixel, is the mechanical maximum. The width is typically between 1 and 3 micrometers. FIG. 14A shows the easiest design of a pixel with two isolating arms cut out on two opposite sides. In the simplest version, each arm consists of a conducting layer and a layer of sensitive material.

According to the state of the art, zones III perform three main functions:
  mechanically support the I+II assembly;
  connect zones II to electrical inputs in the readout circuit;
  position the complete device in altitude.

According to the preferred embodiment, these zones are made using compact pillars, which simply requires an opening in zone III. Contact between the conducting electrodes 13 and 13', which extends as far as zone III, is provided mainly by a metallic deposit preferably made by LPCVD, typically made of tungsten, but other materials deposited by LPCVD such as titanium may also be used.

FIGS. 11A, 11B and 12A and 12B show cases of connection pillars in accordance with the preferred embodiment using an LPCVD deposit. Other embodiments are also possible, for example a sprayed metallic deposit but in this case it will be necessary to provide large diameter connections (several micrometers) with sloping sides. The result will be that more space will be lost (reduction of the filling factor). The pillar body is typically composed of several layers designed to perform the various detailed functions of the connection as described below.

The most attractive configuration consists of making the pillar by an LPCVD deposit of a single sufficiently conducting material (refractory metal typically such as titanium) in order to satisfy all technological constraints of the electrical contact between electrode 13 and the metallic contact rigidly attached to the substrate, at the same time. Considering the very high resistance of the bolometer itself (typically 1 MΩ to 100 MΩ), there is no need to provide contacts with very low internal resistance (Rc). Thus titanium or titanium nitride, for example, can be used directly for this type of embodiment since they have the required qualities to satisfy other technological assembly constraints. The following detailed description assumes the (traditional) use of two metallic layers, namely titanium and tungsten.

The height of the pillar justifies the spacing between the sensitive part and the subjacent circuit. This spacing is conform with the state of the art and is close to λ/4 to center the absorption maximum close to λ if the surface of the circuit is provided with an infrared reflector.

The manufacturing process for the microbolometer type detector according to the invention is typically done using a previously manufactured readout circuit, itself obtained making use of known techniques, for example microelectronics on a silicon S substrate. Elements used on the surface of this type of circuit usually include peripheral metallic assembly contacts (not shown) for integration of the final product into a package under a vacuum, and contacts 20 to connect each elementary point in the detection device to the corresponding points in the readout circuit. These contacts 20, like assembly contacts, are usually all located in the last metallic interconnection level in the readout circuit. This type of metallic layer is usually passivated using a mineral insulating layer. This mineral layer is etched on part of the surface of contacts 20, and of assembly contacts. Therefore, the manufacturing process for the detector according to the invention starts from the structure made in this way.

Steps not described in the following sequence will use existing techniques well known to those skilled in the art.

The following sequence of steps may be used in an example of the manufacturing process:

(It should be noted that the solid lines in the top views described below, correspond to the contours of the lithographic level considered, and the dashed lines represent one or more lower levels).

1/ Step 1 (FIGS. 8A, 8B): metallic deposit to make the reflector (21).

200A to 500A (20.0 to 50.0 nm) of titanium and 1000A (100 nm) of aluminium, for example, deposited by spraying, are sufficient.

2/ Step 2: definition of the reflector patterns using a first lithographic level, and etching of the reflector using techniques known to those skilled in the art.

3/ Step 3: spreading of a polyimide layer (22) and annealing of this layer at a temperature of the order of 400 to 450° C.

The average thickness after annealing is about 2.5 micrometers to provide the resonating cavity effect in accordance with the state of the art (the topography of the readout circuit induces a thickness dispersion, which is not very critical). This annealing is necessary to prevent properties of the polyimide from changing during the rest of the process. The maximum thickness reached during this annealing must be at least equal to the maximum temperature reached in subsequent steps of the manufactured of the detector.

4/ Step 4 (FIGS. 9A, 9B) : deposit, typically by reactive spraying, of a layer of titanium nitride 23 and a layer of aluminium 24.

The titanium nitride forms the bolometer electrodes (since the aluminium layer is eliminated later). Therefore, its thickness must be appropriate for the optical absorber function in accordance with the purpose of the invention. The choice of titanium nitride is beneficial for several reasons; it forms good quality contacts with amorphous silicon; it is relatively easy to deposit in very thin layers; it has a fairly high, and possibly adjustable, resistivity; and in particular it is easy to very selectively etch a layer of aluminium deposited on it. For a typical resistivity of 130 to 140 $\mu\Omega$ cm (0.00000013 to 0.00000014 $\Omega$m) about 75 Angstroms (7.5) of titanium nitride are deposited.

5/ Step 5: masking of the contact openings to the readout circuit which are called "vias" using a second lithographic level, and etching of the aluminium layer, the titanium layer, and the polyimide layer as far as its base, using techniques known to those skilled in the art.

6/ Step 6 (FIG. 10): deposit of titanium (25), typically by cathodic spraying.

The function of the titanium is to provide a good quality electrical contact between the aluminium in the reflector, and the aluminium on the polyimide surface, and the filling material for the vias (tungsten).

7/ Step 7: LPCVD deposit of a layer 26 of tungsten between 5000 Angstrom to 1 micrometer (500 to 1000 nm) thick, using techniques known to those skilled in the art.

One beneficial alternative for metallization consists of directly depositing titanium only by LPCVD, to replace the sixth and seventh steps. The resistance of bolometers is very high compared with the internal resistance of the contact and the connection pillar thus made by layers 25, 26, and there is no need to use complex techniques with two successive layers according to traditional practice in the subject.

8/ Step 8 (FIGS. 11A, 11B): definition of the metallic connections using a third lithographic level.

Typically, the surface protected by the photosensitive resin covers the previous openings by 1 to 2 micrometers in order to provide metallic electrical continuity between the titanium nitride electrode and the input to the readout circuit, through the pillar thus formed.

9/Step 9: etching of the tungsten and titanium, or the single layer of titanium depending on which alternative mentioned above is chosen, then etching of the aluminium in step 4, using typical etching processes.

The photosensitive resin is removed using normal methods.

10/Step 10 (FIGS. 12A, 12B): definition of the layer of titanium nitride, using a fourth lithographic level.

This layer forms the bolometer electrodes. Therefore, the mask design must comply with the design principles described above, which does not imply a detailed lithographic definition. Fairly simple means exist (lithography by proximity/contact) for optimization within the 8–12 $\mu$m band. After this etching, the photosensitive resin is eliminated by routine methods. Depending on the preferred configuration, 2.5 to 4 micrometer wide interleaved electrodes are defined with a spacing of 2.5 to 4 micrometers making use of a simple parallel network.

11/Step 11 (FIG. 13): deposit of the bolometric material (27), typically but not exclusively made of doped amorphous silicon.

This type of deposit makes use of known techniques for optimization and control of the resistivity as a function of the gas mixture and other deposit parameters. The material resistivity must be adapted to the design of the electrodes, or conversely the design of the electrodes may be adapted to the maximum resistivity that can be reproduced. In the preferred configuration, typically 1000 Angstroms (100 nm) of PECVD p type amorphous silicon are deposited with a resistivity of 200 k$\Omega$cm, using an appropriate gas mixture.

12/Step 12 (FIGS. 14A, 14B): definition and etching of the elementary point(s) and thermal insulation arms using a fifth and final lithographic level making use of techniques known to those skilled in the art.

13/Step 13: release of microstructures, typically using a dry oxidizing etching such as that used by the expert in the field for the dry elimination of photosensitive resins.

In practice, it is necessary to test or sort functionalities, and particularly to cut out components, before releasing structures, for reasons of brittleness and contamination during these various steps. After release, the devices are mounted under vacuum in a chamber with adjustable temperature and containing the necessary optical elements.

We will now consider several alternatives of the device according to the invention.

Titanium nitride and amorphous silicon usually have a high level of internal stresses. The simplest layout proposed in two superposed layers (the "preferred" configuration) can result in large deformations after the release step, due to the "bimetallic strip" effect.

In this case, it is useful to compensate for this effect by judiciously adding appropriate layers on each side of the conducting elements. Thus as mentioned above, the sensitive material can be placed on each side of the conducting elements; it is also possible to deposit the sensitive material on one side of the conducting elements, and a layer of passive material on the other side. Finally, it is also possible to deposit a layer of passive material on the surface(s) of the sensitive material not in contact with conducting elements.

The "passive" material is preferably a material with low thermal conductivity since these layers are also used in the insulating arms. Therefore, silicon oxide (SiO), silicon nitride (SiN) or amorphous silicon deposited using traditional methods will be used in preference.

Without significantly complicating the process, it is also possible for example to deposit a layer 30 of silicon oxide or silicon nitride or amorphous silicon 100 to 200 (10.0 to 20.0 nm) Angstrom thick on the surface of the polyimide, before depositing the titanium nitride electrode, and/or an identical layer 31 after depositing the sensitive material. These two layers are etched with the others during the twelfth step.

Figure 15:
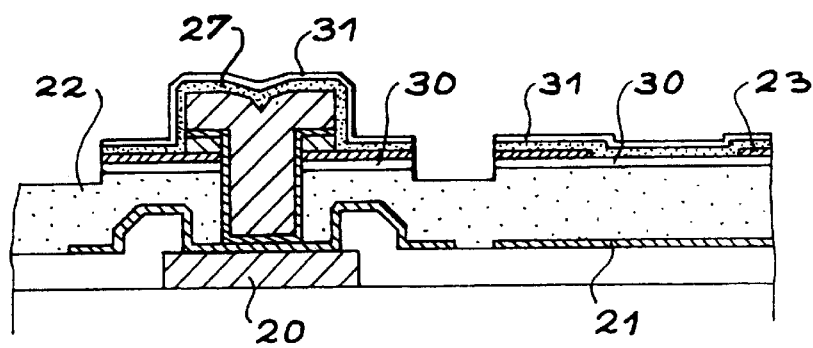

The preferred configuration is a symmetrical stack that efficiently stabilizes the structure, in accordance with FIG. 15. One advantage associated with this layout is the electrical passivation effect of unmetallized surfaces of material that may or may not be sensitive with respect to the electrodes.

The additional mass may be compensated simply by an equivalent reduction in the layer of sensitive material, for example made of amorphous silicon. The densities and intrinsic heat capacities of silicon nitride, silicon oxide and amorphous silicon are not very different, nor are their respective thermal conductivities.

Another beneficial configuration can be made, also in order to improve the mechanical stability of the released structures, and possibly the electrical stability of the bolometers. This consists of a symmetrical distribution of active layers (and possibly passive layers) on each side of the titanium nitride electrode in accordance with FIG. 16.

In the most sophisticated case in which the amorphous silicon surfaces are passivated on the surface of the polyimide (between the first step and the second step), it is simply necessary for example to deposit a 100 to 200 Angstrom (10.0 to 20.00 nm) thick layer 32 of silicon nitride followed by a 300 to 400 Angstrom (30.0 to 40.0 nm) thick layer of slightly doped amorphous silicon 33. During the eleventh step this sequence is repeated but reversed, i.e. using 300 to 400 Angstroms (30.0 to 40.0 nm) of slightly doped silicon (34), followed by 100 to 200 Angstroms (10.0 to 20.0 nm) of silicon nitride (35).

All stacked layers are then etched during the twelfth step, as described above. The total mass is similar to the reference stack, but the structure is particularly stable by construction since it is perfectly symmetric. Furthermore, the central titanium nitride electrode is in contact with amorphous silicon on its two surfaces, which tends to improve the injection of current passing through the structure.

FIGS. 8A to 16 which illustrate the process according to the invention, show sectional views of the structure made, and views of the lithographic levels in the various steps in the said process, or its alternatives.

Figure 8A:
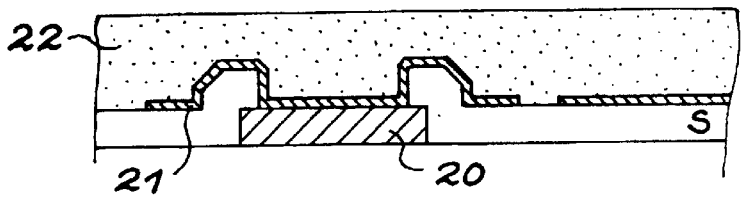
FIGS. 8A, 9A, 10, 11A, 12A, 13, 14A, 15 and 16 illustrate different sections through the structure formed by the detector according to the invention, during its manufacture.
Figure 8B:
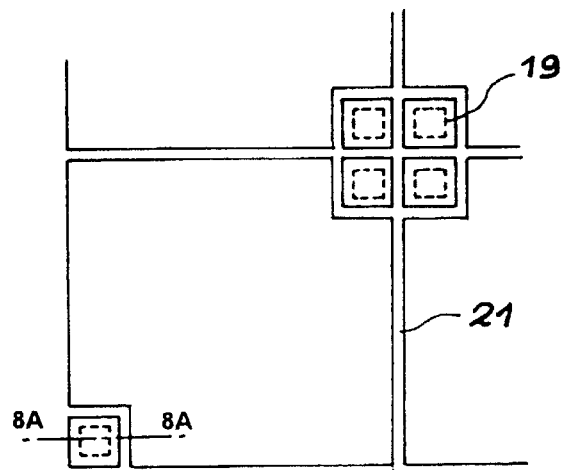
FIGS. 8B, 9B, 11B, 12B, and 14B illustrate views of different lithographic levels of the detector according to the invention, during its manufacture.

FIG. 8A illustrates section AA' shown in FIG. 8B after definition of the reflector 21.

Figure 9A:
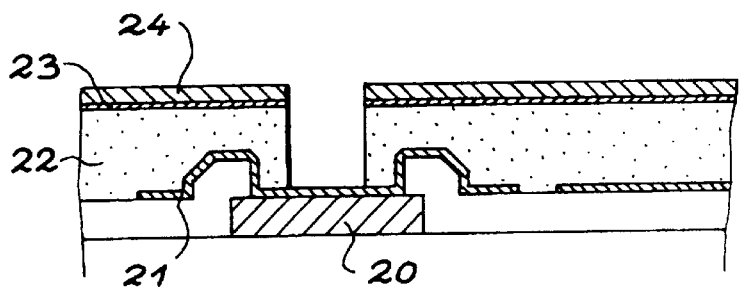
Figure 9B:
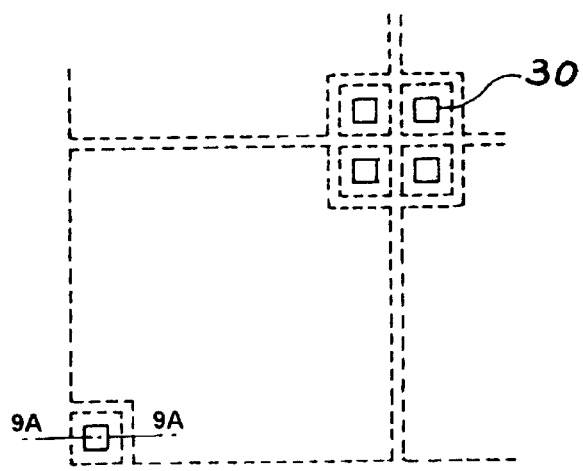

FIG. 9A illustrates section AA' shown in FIG. 9B after definition of the connection openings 30.

Figure 10:
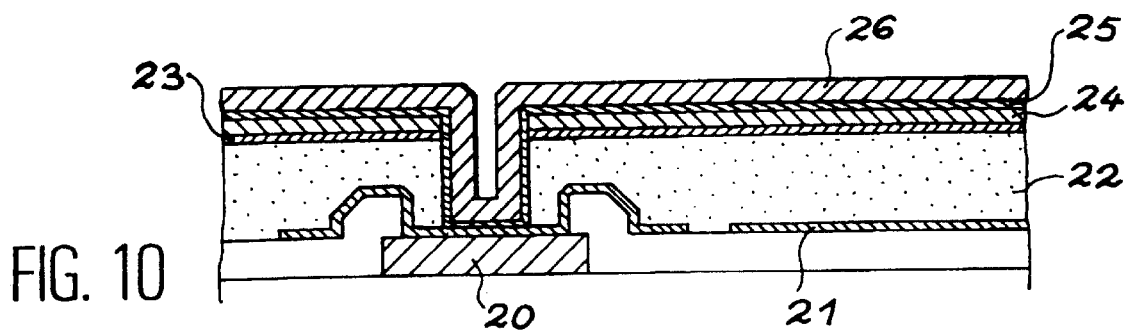

FIG. 10 illustrates a section AA' after deposit of the Interconnection metallization.

Figure 11A:
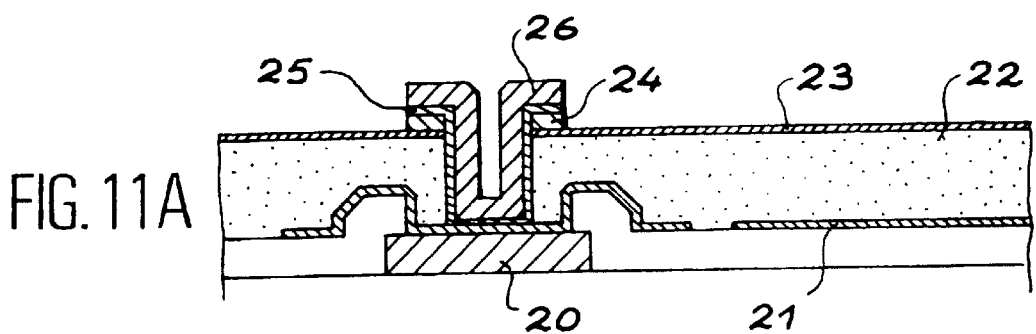
Figure 11B:
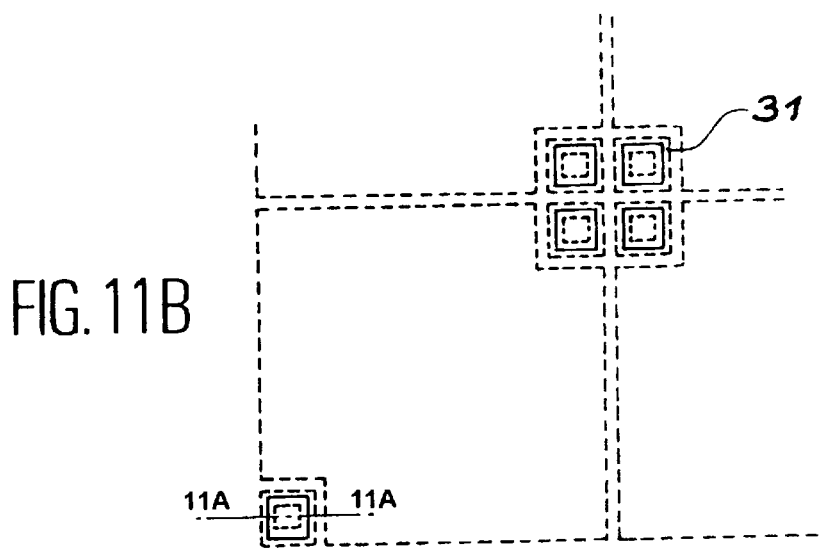

FIG. 11A illustrates section AA' illustrated in FIG. 11A after definition of the metallic interconnection; metallic openings 31 being shown in FIG. 11B.

Figure 12A:
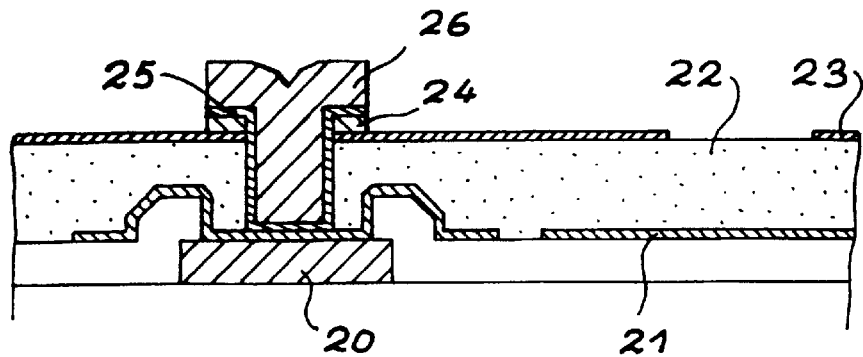
Figure 12B:
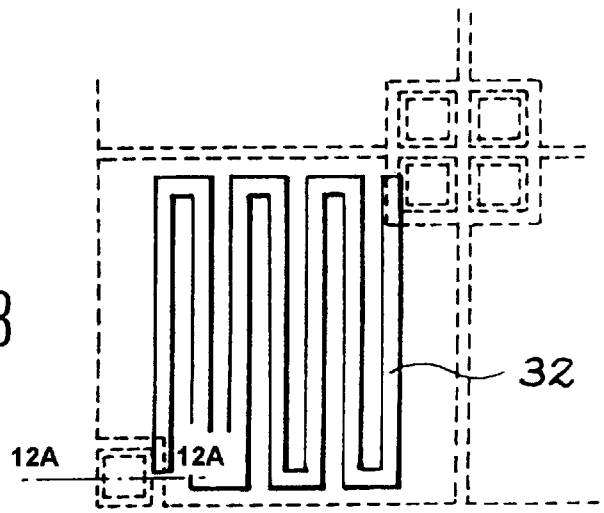

FIG. 12A illustrates section AA' illustrated in FIG. 12B after definition of the electrodes with a higher tungsten thickness ("plug" configuration); reference 32 on FIG. 12B shows an open pattern (etched zone).

Figure 13:
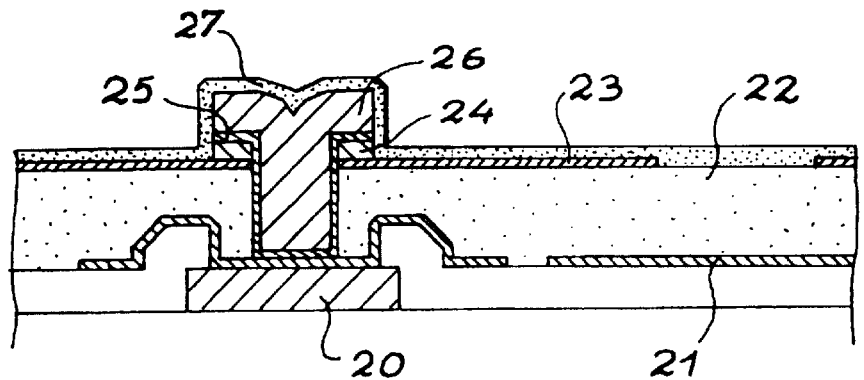

FIG. 13 illustrates section AA' after the bolometric material has been deposited.

Figure 14B:
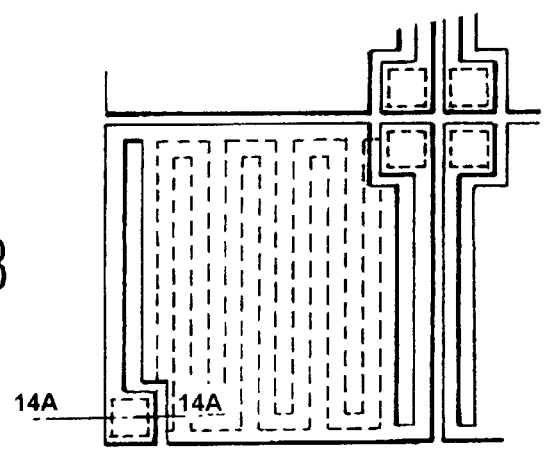

FIG. 14A illustrates section AA' shown in FIG. 14B after cross linking.

FIG. 15 illustrates section AA' of a passivated structure (first alternative).

Figure 16:
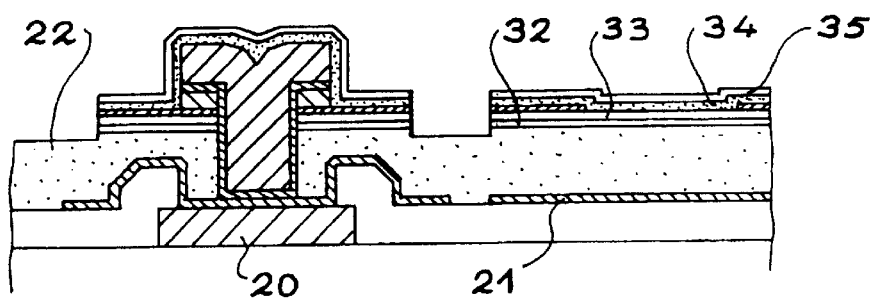

FIG. 16 illustrates a symmetrical passivated structure (second alternative).

We claim:

1. The invention relates to an infrared detector including:
   a sensitive part comprising
      a sensitive element comprising a layer of material in which the resistivity varies with the temperature,
      conducting elements carrying out the function of electrodes for the said detector and the function of infrared absorber;
   at least one support element for the sensitive part capable of positioning the said sensitive part, electrically connecting it to a readout circuit and thermally insulating it from the readout circuit;
   in which all conducting elements are placed on the same surface of the layer of temperature sensitive material.

2. Detector according to claim 1, in which the conducting elements comprise two interleaved electrodes simultaneously performing the functions of electrodes and absorbers, these electrodes being connected to the readout circuit.

3. Detector according to claim 1, in which the conducting elements comprise two electrodes of a first type connected to the readout circuit, and at least one electrode of second type at a floating potential, the electrode of the second type performing solely the absorber function and the electrodes of the first type performing the functions of electrodes and absorber at the same time.

4. Detector according to claim 1, in which at least two conducting elements provide the electrical connection to the readout circuit.

5. Detector according to claim 1, in which the said surface of the sensitive material layer is the lower surface, the conducting elements being located on the said layer.

6. Detector according to claim 1, in which the said surface of the layer of sensitive material is the upper surface, the conducting elements being located on the said layer.

7. Detector according to claim 1, further comprising a second layer of sensitive material wherein the conducting elements are placed on the same surface of the first layer and the conducting elements are inserted between the two layers of sensitive material.

8. Detector according to claim 1, in which the temperature sensitive material is amorphous silicon or vanadium oxide.

9. Detector according to claim 1, in which the free space defined between the conducting elements is composed solely of temperature sensitive material.

10. Detector according to claim 1, in which a reflector is provided on a surface of a substrate supporting the readout circuit, and located at $\lambda/4$ under the plane of the sensitive element, where $\lambda$ is the typical wave length of the received radiation.

11. Detector according to claim 1, in which the pattern of the conducting elements is repeated at a pitch typically between $\lambda$ and $\lambda/2$ to obtain an average absorption exceeding 90%.

12. Detector according to claim 1, in which each support element includes at least one connection pillar and at least one arm.

13. Infrared detector which is composed of a set of detectors according to claim 1.

14. Process for the manufacture of an infrared detector, which comprises the following steps, starting from a previously manufactured readout circuit made on a substrate:
   a) formation of a sacrificial layer;
   b) deposit of at least one conducting layer to make conducting elements;
   c) make at least one contact opening to the readout circuit by local etching of the conducting layer and the sacrificial layer;
   d) deposit of at least one conducting material and etching of this material in order to form the electrical connection between conducting elements and the readout circuit, the pattern thus being formed making up the support pillar;
   e) etching of the conducting layer deposited in step b) in order to define the patterns of the conducting elements;
   f) deposit of the temperature sensitive material on the assembly, and etching of the various layers located above the sacrificial layer in order to define the sensitive element and the support arm;

g) etching of the sacrificial layer so as to release the sensitive part and the pillar.

15. Process according to claim 14, in which step f) depositing the sensitive material is done before step b), the sensitive material then being etched in step c).

16. Process according to claim 14, further comprising the step of depositing a first layer of sensitive material before step b) wherein the sensitive material is deposited as a second layer in step f), the first layer of sensitive material then being among the layers etched in step c).

17. Process according to claim 14, in which step d) is done before step b).

18. Process according to claim 14, in which a metallic layer is deposited and etched to form a reflector, before step a).

19. Process according to claim 14, in which the sacrificial layer is a polyimide layer which is annealed.

20. Process according to claim 14, in which the conducting layer in step b) is a dual layer of titanium nitride and aluminium, the conducting material in step d) then being deposited after completing steps b) and c), this conducting material and the aluminium then being etched in the same way as in step d).

21. Process according to claim 14, in which the conducting material in step d) is the multilayer, at least one of the layers being formed by LPCVD.

22. Process according to claim 14, in which the conducting elements have first and second surfaces, the sensitive material being in contact with one of the surfaces of the said elements, the other surface being in contact with a layer of passive material.

23. Process according to claim 14, in which a layer of passive material is deposited on the surface(s) of the sensitive material not in contact with conducting elements.

24. Process according to claim 23, in which the passive material is chosen from silicon oxide, silicon nitride and amorphous silicon.

* * * * *